United States Patent [19]

Enloe et al.

[11] Patent Number: 5,017,434
[45] Date of Patent: May 21, 1991

[54] ELECTRONIC PACKAGE COMPRISING ALUMINUM NITRIDE AND ALUMINUM NITRIDE-BOROSILICATE GLASS COMPOSITE

[76] Inventors: Jack H. Enloe, 8535 Hayshed La., Columbia, Md. 21045; John W. Lau, 14309 Night Hawk Way, Gaithersburg, Md. 20878; Roy W. Rice, 5411 Hopark Dr., Alexandria, Va. 22310

[21] Appl. No.: 286,557

[22] Filed: Dec. 19, 1988

Related U.S. Application Data

[63] Continuation-in-part of Ser. No. 148,829, Jan. 27, 1988, Pat. No. 4,920,040.

[51] Int. Cl.$^5$ ........................ C03C 10/00; B32B 15/00
[52] U.S. Cl. ................................... 428/428; 428/195; 428/209; 428/217; 428/426; 428/432; 428/433; 428/698; 428/699; 428/701; 428/901
[58] Field of Search ............... 428/698, 699, 701, 901, 428/432, 426, 433, 428, 217, 195, 207

[56] References Cited

U.S. PATENT DOCUMENTS

| | | | |
|---|---|---|---|
| Re. 32,111 | 4/1986 | Lambert et al. | 428/698 |
| 3,904,551 | 9/1975 | Lundsager et al. | 252/477 R |
| 4,313,026 | 1/1982 | Yamada et al. | 174/68.5 |
| 4,591,537 | 5/1986 | Aldinger et al. | 428/698 |
| 4,659,611 | 4/1987 | Iwase et al. | 428/901 |
| 4,756,976 | 7/1988 | Komeya et al. | 428/701 |
| 4,770,953 | 9/1988 | Horiguchi et al. | 428/699 |
| 4,775,596 | 10/1988 | Holleran et al. | 428/432 |

FOREIGN PATENT DOCUMENTS 0253342 11/1987 European Pat. Off. .

OTHER PUBLICATIONS

NEC Res. & Develop., No. 75, Oct. 1984, pp. 8-15.
Eustice, A. L. et al., Low Temperature Co-Firable Ceramics: A New Approach for Electronic Packaging, Proceedings-Electronic Components Conference 36th Publication by IEEE, New York, NY, pp. 37-47 [1986].

Primary Examiner—Ellis P. Robinson
Assistant Examiner—Archene A. Turner

[57] ABSTRACT

An electronic package comprising dielectric layers including a densified aluminum nitride (AlN) base layer and at least one densified AlN-borosilicate glass composite layer bonded thereto is described. Any of the dielectric layers may be metallized with conductive circuit patterns and can contain conductive vias. Production of this package is accomplished by hot pressing a greenware laminate comprising a densified base (e.g., AlN); at least one green sinterable sheet (e.g., AlN-borosilicate glass composite); and a green sheet of non-sinterable material (e.g., boron nitride [BN]). The respective green sheets comprise homogeneous mixtures of the ceramic powders and a binder, e.g., polyethylene. The polyethylene is burnt off during the hot press operation. Residual BN is removed by brushing and/or grit blasting, leaving the finished electronic package, all ceramic elements of which are densified. The package provides superior thermal conductivity, strength, dielectric properties, and silicon-compatibility.

6 Claims, 7 Drawing Sheets

ELECTRONIC PACKAGE COMPRISING ALUMINUM NITRIDE AND ALUMINUM NITRIDE-BOROSILICATE GLASS COMPOSITE

CROSS REFERENCE TO RELATED APPLICATION

This application is a continuation-in-part of application U.S.S.N. 148,829 filed Jan. 27, 1988, "Hot Pressing Dense Ceramic Sheets for Electronic Substrates and for Multilayer Ceramic Electronic Substrates," in the name of Enloe, Lau, Lundsager, and Rice, now U.S. Pat. No. 4,920,640, which describes various features of interest in the present application, including aluminum nitride (AlN) green sheets, sandwiching same between boron nitride (BN) green sheets, hot-pressing the laminate, removal of BN, etc. This application is herein incorporated by reference in its entirety.

BACKGROUND OF THE INVENTION

1. Field of the Invention

This invention is directed to producing a fully dense ceramic laminate comprising a thermally conductive ceramic in layered contact with one or more layers of ceramic glass composite and the resulting unique product. Any or all of the layers may be metallized and as such can contain electrical circuit patterns, ground planes, etc. as required to build electronic packages for integrated circuit devices.

2. Description of the Previously Published Art

Some of the basic functions of electronic packages (or substrates) are to provide mechanical support for, provide electrical connections for, and dissipate heat generated by integrated circuit (IC) devices. Mechanical support is necessary to facilitate handling and prevent breakage of the IC during installation or operation of the device. Electrical connections (or wiring) on the packages provide power inputs, interconnects between devices, ground planes, etc. for the IC. Heat dissipation is required to avoid severe thermal excursions which could result in decreased reliability and device failure.

IC performance trends, which include increased function density, power density and speed, are placing more stringent requirements on the electronic package functions. These trends are resulting in the need for packages which have increased wiring density and improved thermal management capability. As a consequence of this an electronic package should consist of a dielectric support with better dielectric and thermal performance. Lower dielectric constants are desirable to decrease signal propagation delays in the conductor lines, which limit operating speeds. Lowering of the dielectric constant would also decrease electrical noise resulting from capacitance between neighboring conductor lines. This becomes more critical as the wiring density increases.

Thermal performance of the package is also an important consideration. High thermal conductivity is desired to avoid severe heating of the device, which can compromise both performance and reliability. Coupled with this is a desire to match the thermal expansion of the package with that of the IC, since some heating is unavoidable. Poor thermal expansion matching can result in substantial stresses and mechanical failure at the IC/package interface. The predominant IC material at present is silicon, which has a thermal expansion coefficient of approximately $3 \times 10^{-6}/°$ C. from room temperature to 300° C.

Ceramics are often chosen for high reliability packaging because, in general, they provide the best compromise of the above-mentioned properties within affordable processing constraints. Ceramic packages often offer the capability of producing a hermetic package, which can provide superior protection of the IC from harsh environmental conditions and is often required for high reliability applications. They also have a higher Young's modulus than plastic packages, which provides more mechanical protection for the IC device.

The importance of dielectric constant and thermal conductivity for electronic packaging has resulted in two broad classes of ceramic packaging materials: (1) those possessing a relatively high thermal conductivity, but a relatively high dielectric constant and (2) those possessing low dielectric constants, but also a relatively low thermal conductivity. Choice of ceramic material for electronic packaging often depends in part on the relative importance of thermal conductivity and dielectric constant for the specific application.

Within the class of thermally conductive ceramic packaging materials, alumina ($Al_2O_3$) is clearly the most commonly used. Other available choices include beryllia (BeO) and (more recently) aluminum nitride (AlN). Processing of these materials is characterized by relatively high sintering temperatures (approximately 1400° C. to 2000° C.). Hence, they are co-firable only with refractory metals (e.g., tungsten, molydenum). Table 1 lists representative properties for these materials. Each has attributes which can make it the desired choice for specific applications. For instance, $Al_2O_3$ is most often chosen because it provides reasonably high thermal conductivity at the lowest cost. BeO and AlN are more expensive at present, but provide significantly higher thermal conductivities which may be required for extremely high power applications. BeO offers the additional advantage of having a significantly lower dielectric constant than the other two; however, the toxicity of its dust has limited its development and use to a great degree. Besides high thermal conductivity, AlN offers a much better thermal expansion match to silicon than either BeO or $Al_2O_3$.

The approaches to make the low dielectric constant ceramics have generally been to use silicate-based materials since these have some of the lowest dielectric constants for ceramic materials. Many of the silicate-based ceramics offer an additional advantage in that they sinter to near full density at relatively low temperatures (e.g., 800-1000° C.). This makes them compatible with the sintering of more conductive metals such as copper, gold and silver. Use of these conductive metals results in a decrease in localized heating within the conductor lines and a decrease in voltage drops across these lines. This can be of significant importance for packages designed with a high density of fine wiring. One problem with silicate-based materials, however, is that they typically suffer from low thermal conductivity. To counteract this, composites which include a thermally conductive particulate material in a silicate matrix are being considered to provide a better balance between dielectric constant and thermal conductivity. The thermal conductivities of such composites reported in the literature are much less than that of alumina. This limits their use significantly.

TABLE 1

Thermally Conductive Ceramic Packaging Materials
Representative Properties

| Material | Thermal Conductivity (W/cm°K) | Dielectric Constant | Thermal Expansion Coefficient ($\times 10^6/°C.$) |
|---|---|---|---|
| $Al_2O_3$ | 0.25–0.38 | 10 | 6–7 |
| BeO | 1.50–2.50 | 6.7 | 6–7 |
| AlN | 0.70–2.50 | 9 | 4 |

Examples of the ceramic/glass composite approach to electronic packaging can be found in the literature. For instance, researchers have described a glass-ceramic material with a dielectric constant of 7.5 which can be sintered in air at 900° C. and as such is compatible with gold and silver-palladium metals. (See NEC Res. & Develop., No. 75, Oct. 1984, pp. 8–15.) They report a thermal conductivity of 0.042 W/cm° K. and a thermal expansion coefficient of $42 \times 10^{-7}/°$ C. (from room temperature to 250° C.). They indicate that the composite is a 55:45 ratio of alumina to lead borosilicate glass by weight. Combined with density information given, this translates to approximately a 46:54 alumina to glass ratio by volume.

European Patent Application 253 342, published Jan. 20, 1988, Nair, K.M., discloses thick film glass ceramic dielectric compositions comprising aluminoborosilicate glass and AlN.

U.S. Pat. No. 4,313,026 describes a multilayer circuit board with dielectric layers consisting of a borosilicate glass-alumina composite and an alumina sintered plate. They report that at least 50 wt. % of the glass can ensure a high density of the composite. At 40 wt. % glass, the reported composite density is less than 80%. The most preferable glass/ceramic composite was that consisting of 50 wt. % glass and 50 wt. % alumina. This, combined with density information given in the patent, translates to approximately 65 volume % glass and 35 volume % alumina. Properties of this preferred composition were a thermal conductivity of 0.04 W/cm° K., a thermal expansion coefficient of $45 \times 10^{-7}/°$ C. and a dielectric constant.

Researchers at E. I. DuPont de Nemours & Co. describe the properties of a low temperature firing ceramic composite for electronic packaging applications, which is co-firable with gold, silver, and silver-palladium metals. (See Eustice, A. L. et al, Low Temperature Co-firable Ceramics: A New Approach for Electronic Packaging. Proceedings–Electronic Components Conference 36th Publication by IEEE, New York, N.Y., pp. 37–47 [1986].) Composition of the composite is unspecified, except to say that the matrix phase is a glass and the filler phase is a refractory material. Reported properties of this composite included a thermal expansion coefficient of $70 \times 10^{-7}/°$ C. and a dielectric constant of 8.0. The thermal conductivity of this composite is reported to be in the range of 15 to 25% of the value for 96% alumina. Assuming a value of 0.25 W/cm° K. as the thermal conductivity of 96% alumina (reported in the literature), the reported percentages would correspond to 0.037 to 0.062 W/cm° K. for this composite's thermal conductivity.

Homogeneous 3-component blends of ceramic particles, polymers, and mineral oil are well-known, including formation into sheets and removal of the oil by heating or by solvent extraction. See, e.g., U.S. Pat. No. 3,904,551.

The present invention represents a distinct improvement over the old art described above by providing a technique for making multilayer ceramic electronic packages comprised of a thermally conductive base, layers of low dielectric constant composite and conductive metallization. The low dielectric constant material can support layers of electrical circuits on the package and the thermally conductive base is effective in dissipating heat from the IC device.

3. Objects of the Invention

It is an object of this invention to provide a method for manufacturing a ceramic electronic package whereby overall performance is improved through use of ceramic dielectrics where they are functionally superior.

It is also an object of this invention to provide a ceramic electronic package which has dielectric layers of AlN and AlN/borosilicate glass composite, as well as to provide a method for making that package.

It is a further object of this invention to provide an improved method for manufacturing ceramic electronic packages with single or multiple layers of interconnected, electrically conductive circuit patterns using the ceramic composite herein described with electrically conductive metals.

It is an object of the invention to provide a ceramic composite material having a good thermal expansion match to silicon, good thermal conductivity, and low dielectric constant such that when used as the dielectric for an electronic package overall performance is improved.

It is a further object of this invention to provide a method for manufacturing the above ceramic composite.

It is a further object of this invention to provide a ceramic composite with improved performance as an electronic package dielectric which is co-firable with highly conductive metals such as copper, gold, or silver.

These and further objects will become apparent as the description of the invention proceeds.

SUMMARY OF INVENTION

The invention is directed to a fully dense ceramic laminate comprising a thermally conductive ceramic in layered contact with one or more layers of ceramic-filled glass composite, and the process for making the laminate. Any or all of the layers may be metallized, and as such can contain electrical circuit patterns, ground planes, etc. as required to build electronic packages for integrated circuit (IC) devices. An important result of invention is that multilayer ceramic electronic packages can be produced with improved performance, since the ceramic dielectric can be selectively employed at locations in the package where they are functionally superior.

The invention process involves hot pressing a laminate comprising a fully dense thermally conductive ceramic base and green sheets of a ceramic-filled glass composite. Hot pressing is critical to this approach since it allows for: (1) densification of a broader range of composition and (2) unidirectional consolidation of the green ceramic composite sheet(s) onto the already dense ceramic base. Regarding point (1), this process allows for higher particulate filler and lower glass contents than those obtainable by conventional sintering. Consequently, higher thermal conductivities are possible, as well as better mechanical properties (e.g., stiffness). The unidirectional consolidation aspect of this process effectively eliminates delamination and/or substantial interfacial stresses due to lateral shrinkage of the green ceramic composite sheet(s) during consolidate.

It is equally critical that the ceramic base and composite have a good thermal expansion match over the processing temperature range in order to prevent substantial interfacial stresses and/or cracking upon cooling. The dense ceramic base and/or the green ceramic sheets can be metallized by, for example, screen printing metal inks prior to hot pressing. Green sheets of BN are utilized to produce non-planar geometrics (e.g., cavities) and to prevent unwanted chemical interactions between the laminate components (i.e., dielectrics or metals) and the hot press tooling. A preferred embodiment of the process uses a "replication" technique (described below) to assure uniform densification of the composite layers when non-planar geometries are required.

In a preferred embodiment the invention employs (a) a dense, thermally conductive AlN base, (b) a low dielectric constant ceramic composite containing AlN particulates in a borosilicate glass matrix, and (c) copper metallization. The composite layers and copper can be simultaneously consolidated, which allows for multiple levels of copper metallization and the glass composite, all supported by the AlN base. By way of example, a package is described which utilizes the above materials. In this example, package performance is optimized since highly conductive metal leads are supported by a material with relatively low dielectric constant, yet the integrated circuit can be directly mounted on a thermally conductive base to allow efficient heat transfer.

DESCRIPTION OF PREFERRED EMBODIMENTS

Figure 1:
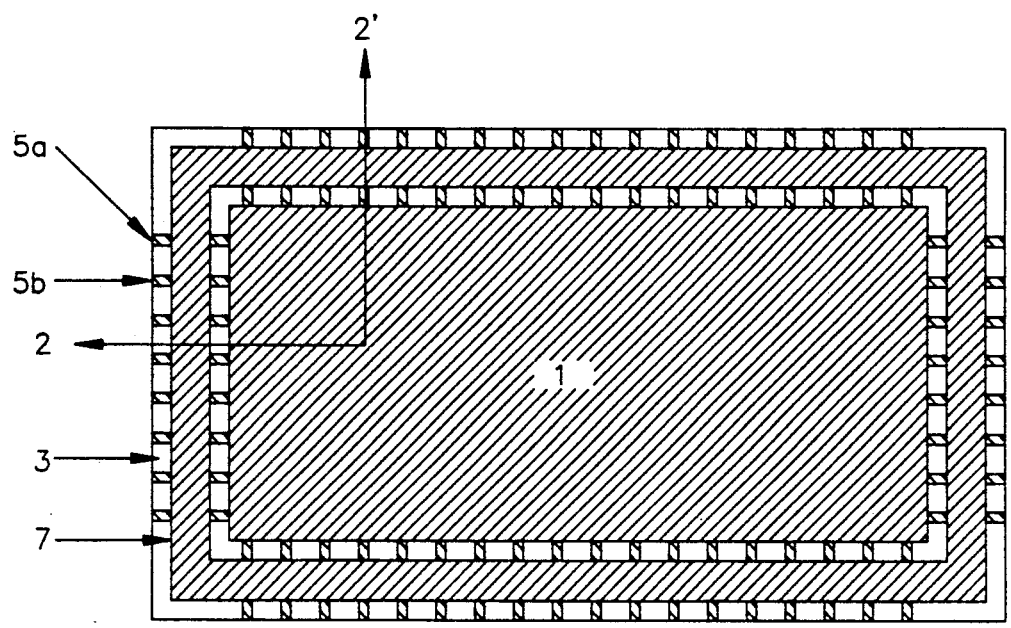
FIG. 1 is a plan view of the electronic package made in Example 1.

This invention involves the production of dense multilayer ceramic laminates which consist of a dense thermally conductive base and layer(s) of a dense ceramic having a low dielectric constant. Any or all of the dielectric layers may support metallization in the form of electrical circuit patterns, ground planes, etc. The metallization at different layers may be electrically connected by way of conductive vias through the dielectric layers. These dense metallized ceramic laminates are useful as ceramic electronic packages and provide a significant improvment over co-fired packages employing a single dielectric. The method of production involves hot pressing laminates comprised of a dense thermally conductive base and green ceramic sheets of a material having a low dielectric constant.

The purpose of the thermally conductive base is to support and dissipate heat from an integrated circuit device. As such, it should have a good thermal expansion match to the IC material. Currently, silicon (Si) is by far the most commonly used IC material. AlN provides the best combination of high thermal conductivity, low dielectric constant, and good thermal expansion match to Si, and hence, is the preferred material for the base layer. The layer(s) of the low dielectric constant material are utilized to support metallization in the ceramic package. A requirement of this material is that it have a good thermal expansion match to the thermally conductive base in order to avoid substantial interfacial stresses. For many applications, the layer(s) of the low dielectric constant material must have a substantial thickness (e.g., greater than 0.025 inches) in order provide cavities and/or steps necessary for the production of hermetically sealed packages.

A major contribution of this invention is the development of a ceramic composite with low dielectric constant, reasonably good thermal conductivity, good strength, and a good thermal expansion match to AlN. This mixture will be referred to as the "composite." This composite can be consolidated by hot pressing from powders to high density below 1000° C. and hence can be co-fired with conductive metals such as copper, silver, and gold.

The ceramic composite preferably consists of AlN particulates in a borosilicate glass matrix. Composition of the borosilicate glass is listed in Table 2. The AlN particles contribute high thermal conductivity to the composite and have a reasonable dielectric constant (9.0). The borosilicate glass contributes a good thermal expansion match to that of AlN. This will minimize residual stresses in the AlN-borosilicate glass composite and at the composite/AlN interface upon cooling after densification in the hot press. Such stresses, if significant, could lead to delayed crack growth and mechanical failure. Borosilicate glass also has a significantly lower dielectric constant than AlN so that the dielectric constant of the resulting composite is low. Borosilicate glass also has good chemical stability. Finally, and very importantly, the glass transition temperature of the borosilicate glass is sufficiently low such that the AlN-borosilicate glass composite can be hot pressed from mixed powders to high density below 1000° C.

TABLE 2

| Oxide Components | Composition of Borosilicate Glass Used to Produce Composite | | | |
|---|---|---|---|---|
| | Broad Range, Wt % | Preferred Range, Wt % | Ex A[(1)] Wt % | Ex. B[(2)] Wt % |
| $B_2O_3$ | 10–28 | 13–28 | 28 | 13 |
| $SiO_2$ | 60–81 | 69–81 | 69 | 81 |
| $Al_2O_3$ | 1–4 | 1–2 | 1 | 2 |

TABLE 2-continued

| | Composition of Borosilicate Glass Used to Produce Composite | | | |
|---|---|---|---|---|
| Oxide Components | Broad Range, Wt % | Preferred Range, Wt % | Ex A[1] Wt % | Ex. B[2] Wt % |
| Others[3] | 2–10 | 2–4 | 2 | 4 |

[1]Used in Example 1 below.
[2]An alternate to Ex. A.
[3]Li$_2$O, Na$_2$O, K$_2$O, CaO.

As with most ceramic powder processing, the average particle size of the AlN and borosilicate powders should be fine enough to promote ease of densification, yet not so fine that excessive agglomeration would occur. Average particle sizes in the range of approximately 0.1 to 20 microns is sufficient for these purposes. It is desirable that the AlN and the borosilciate glass particles be of comparable size to promote uniform mixing and good densification in the hot pressing step. Initially, a homogeneous blend of AlN particles and borosilicate glass particles is prepared by wet or dry grinding, as hereinafter described in Example 1.

To optimize the thermal conductivity in the composite, it is desirable to maximize the AlN content, while still achieving a fully dense (nonporous) microstructure during sintering in the hot press. At these low processing temperatures, AlN is relatively inert; hence it is the borosilcate glass which densifies during sintering. In order to eliminate porosity, it is necessary that sufficient glass be present to fill the interstices between the AlN grains. Even with sufficient glass, full density by sintering can be limited by high surface tension and viscosity of the glass, which inhibit flow into all of the AlN interstices. Inhibition of glass flow is overcome to a great extent in the invention method by the application of external uniaxial pressure in the hot press. Hence, the invention method allows for full density to be achieved in the composite at a higher volume fraction of AlN. This, in turn, translates to a higher thermal conductivity in the composite. In the composite the weight ratio of AlN to borosilicate glass can be about 1:0.45–0.70, preferably about 1:0.53–0.65. As hot-pressed and densified, the composite consists essentially of AlN particles in a matrix of borosilicate glass.

Typical approximate physical properties of our hot-pressed AlN-borosilicate glass composite include:
Thermal conductivity, 0.07 W/cm° K.
Thermal expansion coefficient, $4 \times 10^{-6}$ °C.$^{-1}$.
Dielectric constant, 6.5.
Density, 2.6–2.7 gm/cm$^3$.

Simply put, the salient points of the invention (as it is applied to producing a dense laminate comprised of an AlN base and layer(s) of AlN-borosilicate glass composite) include: (1) preparing green sheet(s) containing AlN and borosilicate glass powders, (2) laminating the green sheet(s) to a dense AlN material, and (3) hot pressing the laminate to densify the composite. Metallization patterns can be applied to the green sheet(s) and/or to the dense AlN prior to the lamination step. BN sheets are used to produce surface cavities in the composite sheet, to expose bare or metallized AlN and/or to protect the entire package from adverse interaction with the hot press tooling (e.g., graphite).

A binder system and method for making green sheets (composite and BN) suitable for hot pressing is given in USSN 148,829 aforesaid. Briefly, this method involves: (1) compounding the ceramic powder, polymeric binder (e.g., polyethylene), and a plasticizer (e.g., mineral oil) at elevated temperatures (e.g., 160° C.), (2) formation of the compounded mixture into sheet by processes such as extrusion through a die, and (3) extraction of the plasticizer by extraction in a suitable solvent. Broadly speaking, the sheet formulation can comprise, in parts by weight:

(a) AlN/borosilicate glass powder mixture, about 75–76;
(b) binder, about 3–5; and
(c) plasticizer, about 20–21.

Removal of the oil or other plasticizer leaves a sheet consisting essentially of AlN particles, borosilicate glass particles, and binder. Merits of this system are thoroughly discussed in the above-mentioned application. A prime advantage of this technique for making ceramic green sheet is that the resultant binder (e.g., polyethylene) leaves no noticeable residue upon pyrolysis in the absence of oxygen. This makes it compatible with the processing of readily oxidized ceramics (e.g., AlN) and metals (e.g., copper). Furthermore, it makes the process compatible with conventional hot pressing technology which commonly utilizes graphite tooling.

Removal of the mineral oil leaves a sheet consisting essentially of AlN-borosilicate glass particles and binder. These two materials will, of course, be present in the same ratio as the starting mix. The ratio for Example 1 is $(45.6+29.7)/(45.6+29.7+4.2)=94.7\%$ ceramic powders, balance binder (polyethylene).

Broadly speaking, after extraction of oil, the greenware sheet consists essentially of a homogeneous mixture in weight % of:
AlN powder, about 57–62.7;
Borosilicate glass powder, about 32.8–37.8; and
Binder, balance to make 100%, said binder being a material which leaves no undesirable residue upon pyrolysis in the absence of oxygen. Preferably the AlN powder is about 57.4%, borosilicate glass powder is about 37.3% and the binder is a polyolefin, e.g., polyethylene.

After extraction, the sheets can be cut to the desired lateral dimensions. In the simplest, this could involve cutting to the external dimensions of the thermally conductive base. However, it is more likely that non-planar geometries would be desired, since these would make fuller use of the advantages this invention has to offer. For surface cavities, this is accomplished by cutting out sheet in the areas where cavities are desired and subsequently filling these cut-out areas with BN sheet of the same dimensions. The BN does not readily densify and hence, serves to maintain the geometry of the cavity during the hot pressing step. After hot pressing, the BN is easily removed by grit blasting and/or washing. The remaining pieces from the cutting operation (both green ceramic and BN) can be saved for the formation of replica sheets to be described later.

After cutting and prior to hot pressing, the green ceramic sheets and the dense base can be appropriately metallized by, for example, screen printing metal inks. Copper has been found to be compatible with the AlN-borosilicate glass composite system described above. Gold, silver, silver/palladium alloys and the like are also useful since the composite can be fully densified by approximately 900° C., which is at or below the normal sintering temperature for these metals.

Vias can be positioned in the green sheets to electrically connect the top surfaces of adjacent sheets. The vias can be filled by conventional metal-containing pastes. However, we prefer filling with greenware tapes, e.g., a homogeneous mixture of metal powder and polyethylene as described in USSN 148,829. Such mixtures are made readily by green sheet procedures earlier described, followed by removal of the mineral oil plasticizer by extraction with trichloroethane or hexane. Such tapes generally offer higher metal loading than pastes and are readily punched into vias. Metals can be the conventional ones, e.g., Cu, W, Mo, Ag, Au, Ag-Pd, etc.

A lamination step is useful prior to hot pressing to form a monolithic green body. This is to assure registration of the conductive layers and minimize contamination from dust and handling. For the binder system described above, suitable lamination conditions are approximately 110° C. and 200 psi pressure.

Referring to the Figures in detail:

In FIG. 1, a densified AlN base layer with metallization is shown at 1. A densified AlN-borosilicate glass composite layer is shown as a lead frame 3 bonded to AlN layer 1. A plurality of leads 5a, 5b, etc., is shown on lead frame 3. A metallized seal ring 7, also of densified AlN-borosilicate glass composite, is bonded to frame 3.

Figure 3:
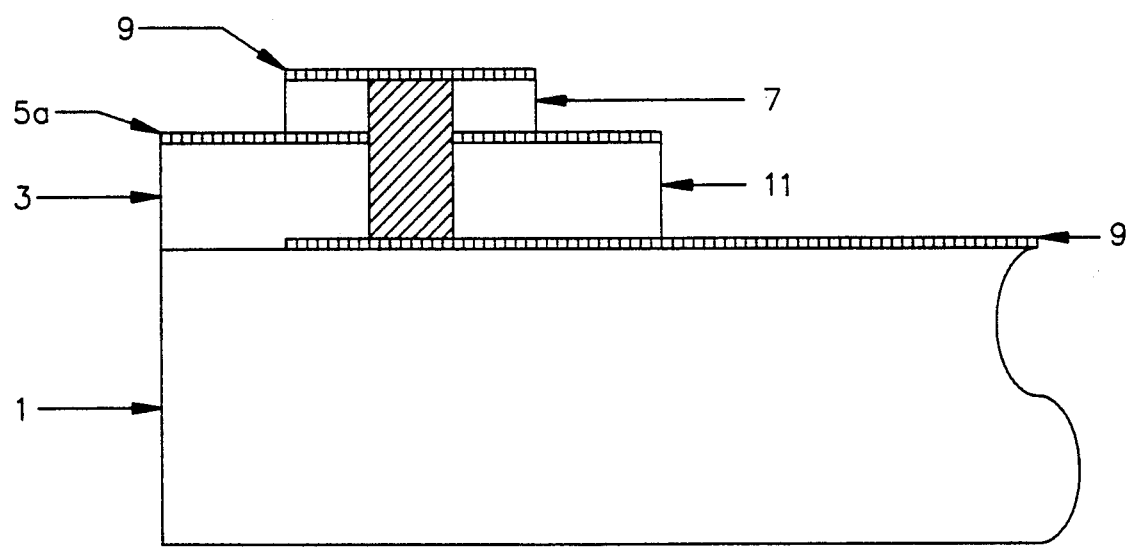
FIG. 3 is a magnified schematic view in section of FIG. 2 taken along the line 3-3', to show a via and metallization.

In FIG. 3 a via is shown at 11 with metallization (magnified) at 9.

Figure 2:
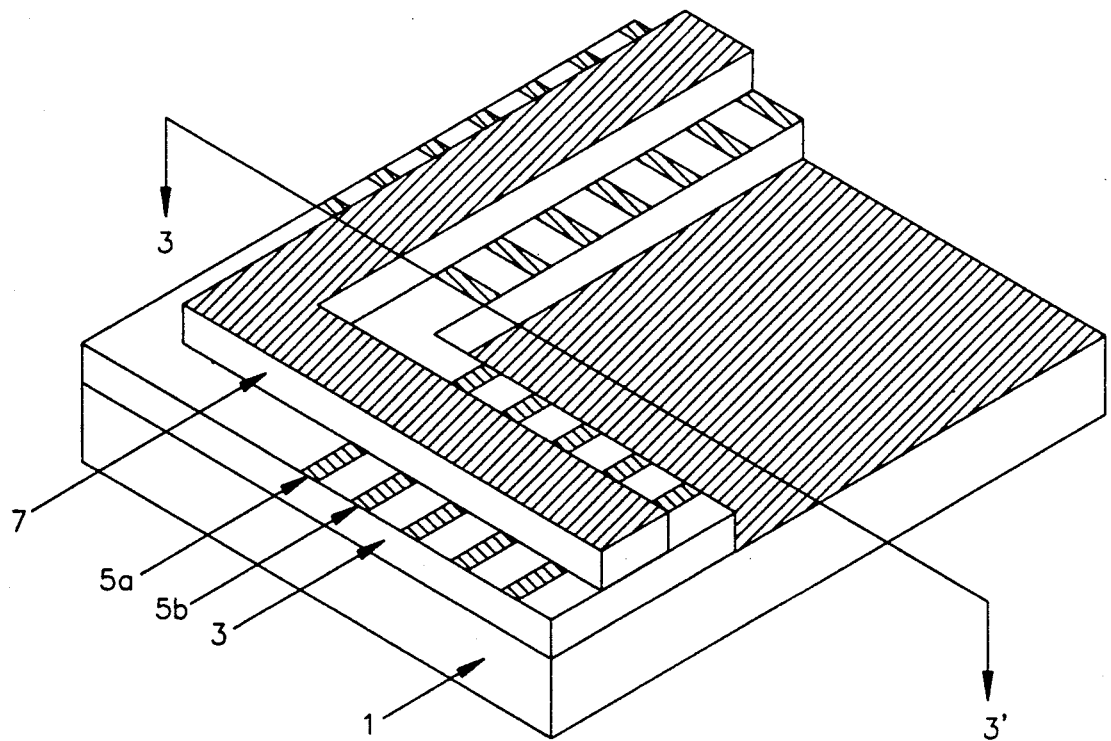
FIG. 2 is a magnified perspective view of a corner of the package of FIG. 1 taken along the line 2—2'.

FIGS. 4–12 show individual layers and final assembly of a greenware laminate for hot pressing, to make the package of FIGS. 1–3, using our preferred replicate technique.

(Note: In FIGS. 4–13 all greenware sheets were formulated with ceramic powder, binder, and plasticizer, all as hereinafter described.)

Figure 4:
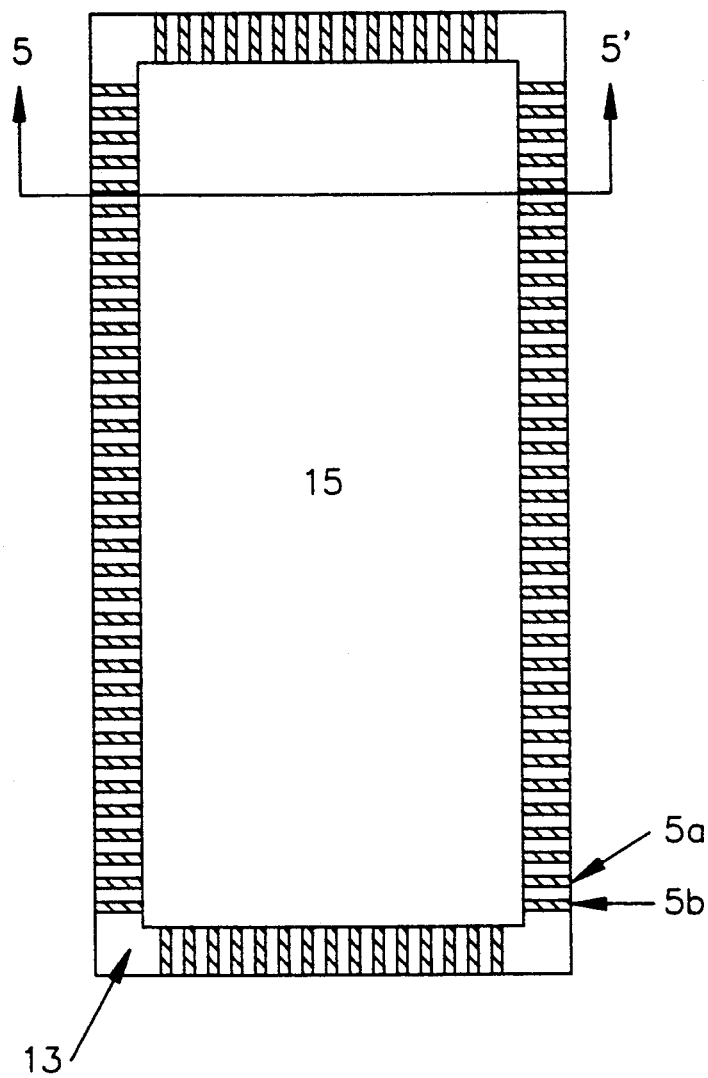
FIG. 4 is a plan view of a greenware lead frame.
Figure 5:
FIG. 5 is a section of the lead frame of FIG. 4 taken along the line 5—5'.

In FIG. 4 a screen-printed greenware lead frame layer is shown at 13, with leads 5a, 5b, etc. This frame 13 is AlN-borosilicate glass composite. It encloses a greenware sheet (plug) of BN, 15.

Figure 6:
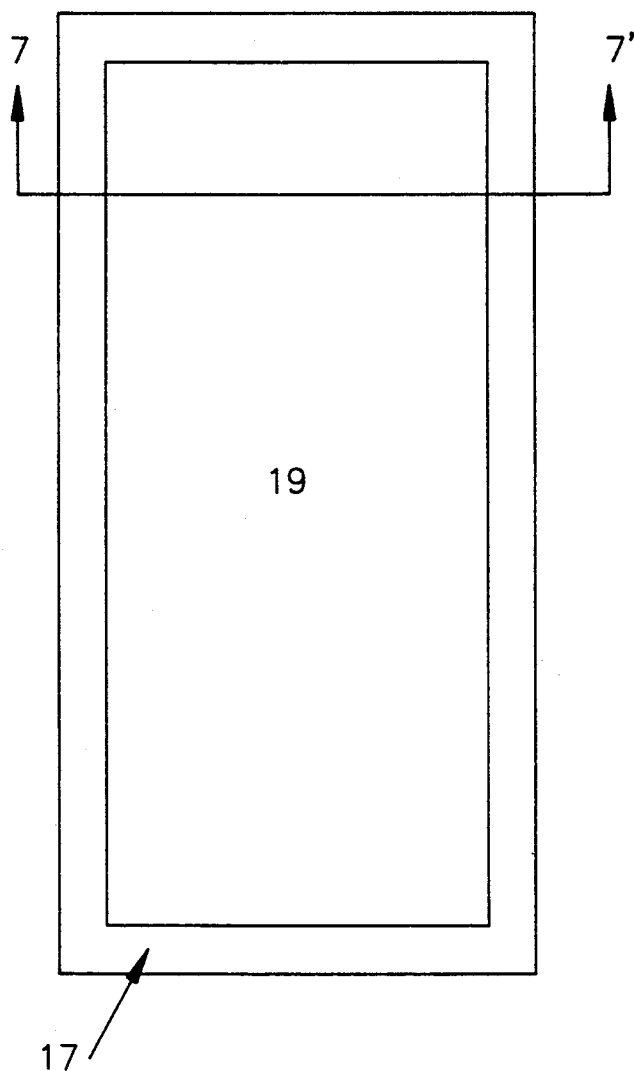
FIG. 6 is a plan view of a replicate for the lead frame of FIG. 4.
Figure 7:
FIG. 7 is a section of the replicate of FIG. 6 taken along the line 7—7'.

FIG. 6 shows a replicate for the greenware lead frame of FIG. 4 consisting of a greenware sheet (frame) of BN 17 enclosing an AlN-borosilicate glass composite greenware sheet (plug) 19.

Figure 8:
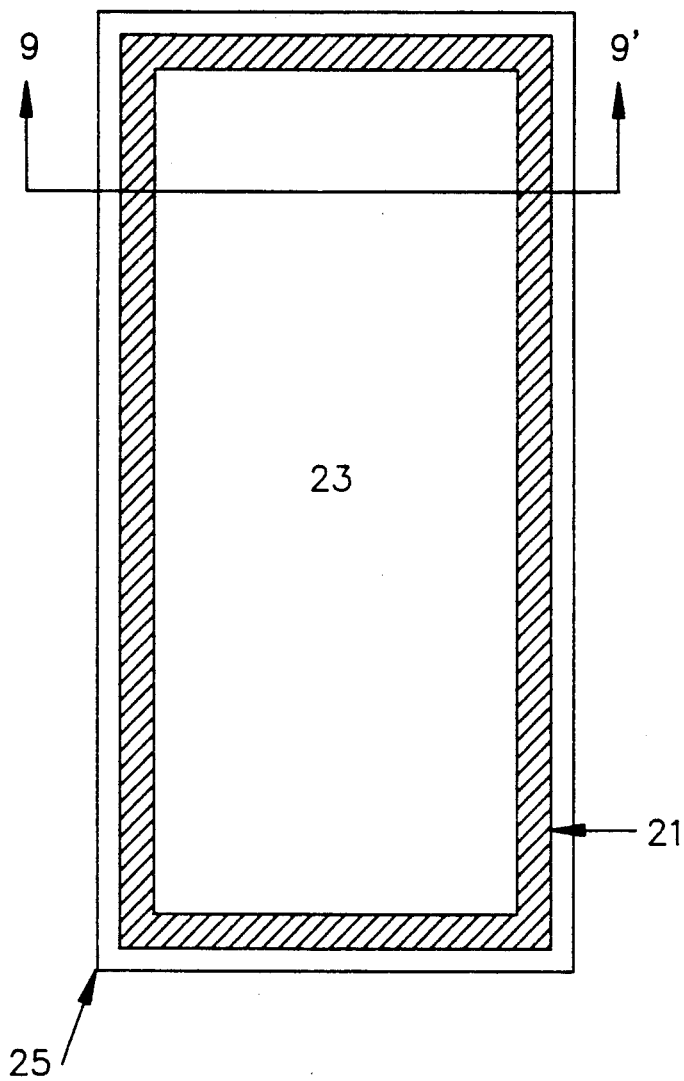
FIG. 8 is a plan view of a metallized greenware seal ring layer.
Figure 9:
FIG. 9 is a section of the seal ring layer of FIG. 8 taken along the line 9—9'.

FIG. 8 shows an AlN-borosilicate composite metallized greenware seal ring layer 21. This seal ring 21 encloses BN greenware sheet (plug) 23 and is enclosed by BN greenware sheet (outside ring) 25.

Figure 10:
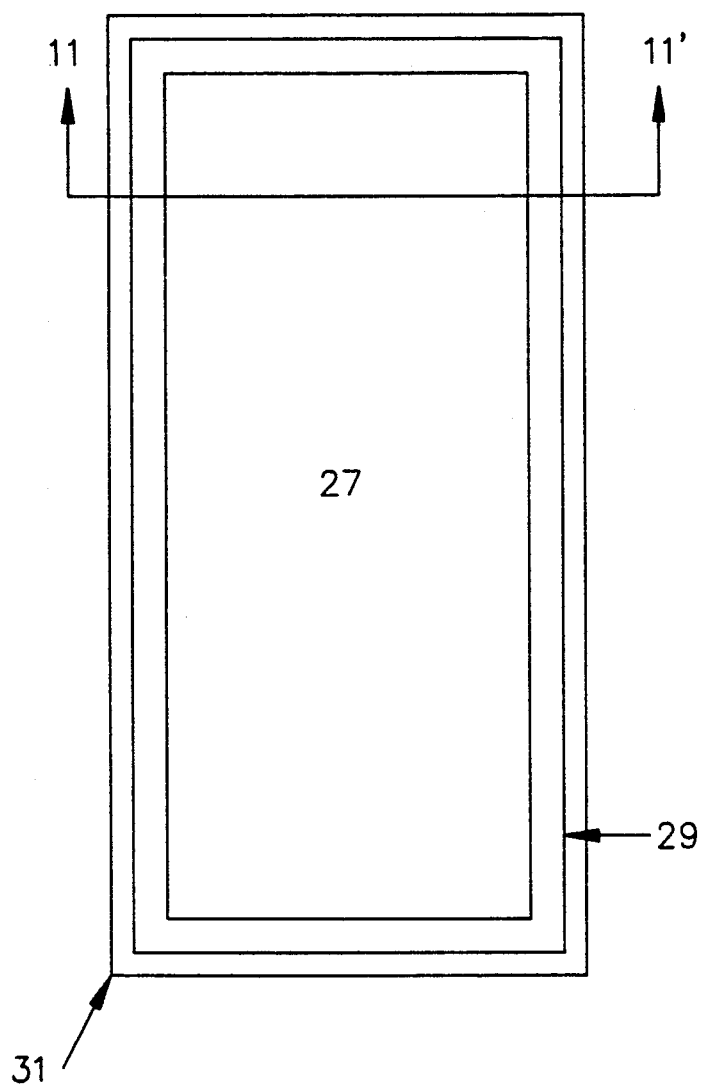
FIG. 10 is a plan view of a replicate for the seal ring layer of FIG. 8.
Figure 11:
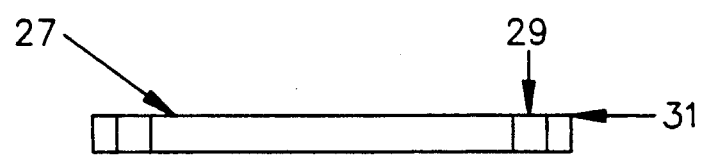
FIG. 11 is a section of the replicate of FIG. 10 taken along the line 11—11'.

FIG. 10, the replicant of FIG. 8, shows an AlN-borosilicate glass composite greenware sheet (plug) at 27, enclosed by a ring of BN greenware 29, which is in turn enclosed by a ring of an AlN-borosilicate composite greenware sheet 31.

Figure 12:
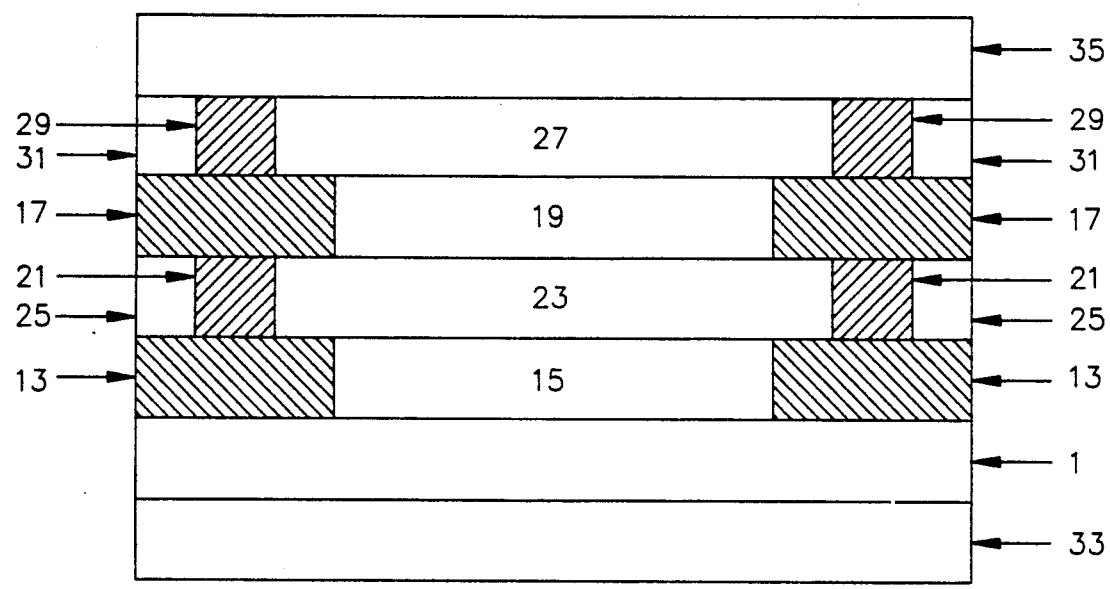
FIG. 12 is a schematic representation in section of a greenware laminate of the invention, with replicant layers. Vertical scale is exaggerated.

FIG. 12 shows a bonded, replicated laminate, comprising all the layers described in FIGS. 4–11, assembled for hot pressing. Additionally, at 33 is shown a layer of BN greenware. This is optional, and may be used at high hot pressing temperatures, e.g., at 1600° C., to minimize reaction with graphite dies. An over-layer of BN greenware at 35 completes the laminate assembly.

Figure 13:
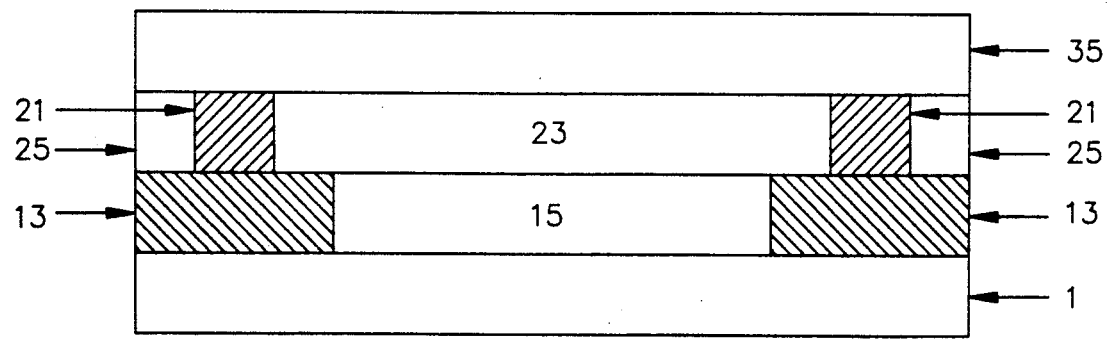
FIG. 13 is a schematic representation in section of a greenware laminate of the invention, without replicant layers. Vertical scale is exaggerated.

FIG. 13 shows a simplified schematic greenware assembly, prepared for hot-pressing, but omitting replicant layers.

Although dimensions are not critical, we note here the dimensions of the package as shown in FIGS. 1 and 2 and produced as described in Example 1:

AlN base 1, 4.5"×2.5"×0.100".
Frame 3, 0.14" wide×0.035" deep.
Seal ring 7, 0.07" wide×0.045" deep.

Herein, "AlN-borosilicate glass" or "AlN-borosilicate glass composite" means a physical mixture of AlN and borosilicate glass. The AlN is always in particle form. Initially the borosilicate glass is in particle form, for example, when first mixed with AlN and when made into a sheet with AlN. During hot pressing the borosilicate sinters and becomes densified and so provides a matrix for the AlN particles. The densified product is referred to as "densified AlN-borosilicate glass composite," "densified composite," or equivalent language.

A preferred method for layering up preforms for ceramic parts with non-planar geometries involves the use of additional replica sheets on top of the desired green body. The replica technique results in a monolith green body having equal thickness of the ceramic to be consolidated through any cross-section. This assures more uniform pressure and consolidation throughout the hot pressing process. FIG. 12 illustrates the cross-section of a preform which contains a replica structure on top. In this FIG., 1, 13, and 17 represent the thermally conductive base, the portion of the package containing the low dielectric constant green sheet, and its replica, respectively. BN sheets are shown laminated to both sides of the preform in this Figure. The purpose of the BN sheets is to protect the package preform from adverse chemical interaction with the hot press rams. The replica green sheets are produced by substituting BN sheet into areas containing the low dielectric constant material sheet and the low dielectric constant material sheet for the BN sheet in the corresponding package preform layer. The cut pieces for producing these sheets are available from the pieces remaining from cutting out the package green sheet layers.

This replication technique is a preferred technique, but it is not absolutely necessary that it be used in this invention. If it is not used, distinct regions of varying density may be noted in the laminate of the product. In the example, for instance, if replication is not used, density in the seal ring region may be sufficiently poor that delamination may actually occur. Such inferior results may nevertheless be acceptable under certain circumstances, depending on configuration of the package, on economics, and on other requirements.

It is important that the preform has a good fit with the hot press die cavity since gaps at the die wall preform interface can result in substantial unwanted flow of material. Preforms can be hot pressed individually or in stacks separated by BN sheets and/or graphite spacers. Hot pressing conditions depend on those required to fully densify the ceramic green body. For the AlN-borosilicate composite, temperatures in the range of approximately 900–1400° C. and pressures between 500 and 1000 psi for approximately 1 to 2 hours have been shown to be suitable for densification. If thermal conductivity is not required, then the AlN content of the composite can be significantly reduced. Consequently, the processing temperature for hot pressing could be reduced to 600° C. After hot pressing under these conditions, the densified replica pieces are easily removed from the top of the package and the undensified BN is removed from the package surfaces by washing and/or light grit blasting. In some instances, some minor machining of the package edges has been necessary to improve the overall package performance.

The following example illustrates without limiting the invention.

EXAMPLE 1

This example illustrates the ability to produce a package consisting of dense AlN base, layers of dense AlN-borosilicate glass composite, and copper metallization. The composite and copper were consolidated on top of the AlN base by co-firing in the hot press. The package produced is useful for large silicon wafer, integrated circuit devices.

Production of this package required a dense AlN plate, green composite sheet, and BN sheet. A method for making large, flat, thermally conductive AlN plates has been described in detail in USSN 148,829. This method, which involves hot pressing green sheets containing AlN powder, was used to produce the dense AlN for this package. Briefly, the method involves blending the following components:

| (1) AlN powder | 68.0 wt % |
|---|---|
| (2) $CaCO_3$ powder | 3.4 wt % |
| (3) Polyethylene | 3.4 wt % |
| (4) Mineral oil | 25.2 wt % | at 160° C., extruding uniformly thick sheets, and extracting the oil from these sheets using trichloroethane. These AlN green sheets (about 40 mils thick) were cut to fit into a graphite die (approximately 2.5×4.5 inches), laminated between BN sheets (whose method of production is described in the following paragraph) and hot pressed to approximately 1900° C. and 700 psi uniaxial pressure in a nitrogen-containing atmosphere. Following the hot press step, the BN was removed by grit blasting to leave a dense AlN sheet. The densified AlN plate had approximate dimensions of 4.5×2.5×0.100 inches.

A preferred method for making the BN sheet is also described in USSN 148,829. This method was used to make the BN sheet for this example. Briefly, the BN sheet formulation consisted of 61 weight percent BN powder, 33 percent mineral oil, and 6 percent of high molecular weight polyethylene. The BN powder used to make these tapes had an average particle size of 0.5 microns (by BET analysis). The above ingredients were compounded and extruded into sheet at elevated temperature (approximately 150° C.). The oil was subsequently extracted from the BN sheet using trichloroethane.

The composite sheet was also produced using a binder system similar to that described in USSN 148,829. Its formulation consisted of 45.6 weight percent AlN powder, 29.7 percent borosilicate glass powder, 20.5 percent mineral oil, and 4.2 percent polyethylene. The AlN and borosilicate glass powders had average particle sizes of 4.5 and 10 microns, respectively. The AlN and borosilicate glass powders were ball-milled for one hour in isopropyl alcohol and filter-dried. The polyethylene and oil were then added to this powder mixture by mechanical mixing. This mixture was made into sheets using the compounding, extrusion and extraction steps mentioned above for the BN sheet. The composite and BN green sheets had similar thicknesses of approximately 0.040 inch.

FIG. 1 and 2 illustrate the package that was made. It is comprised of layers including an AlN base, a lead frame, and a seal ring. The AlN base is exposed in the center portion and metallized with copper. This metallization was applied by screen printing copper powder containing metal ink. This ink was co-fired with the composite layers during the hot pressing step. The base can support a large Si wafer device, providing a good thermal expansion match to silicon and high thermal conductivity. The lead frame supports copper leads, which are used to electrically connect the silicon device to devices external to the package. The seal ring layer sits on top of the lead frame and is used for sealing a lid to the package (to enclose the IC device). It has copper metallization on the top surface. Both the lead frame and the seal ring are comprised of the densified AlN-borosilicate glass composite.

Production of the package described above first required the formation of a green laminate. To produce this laminate, composite green sheets and BN green sheets were first cut to planar dimensions of the dense AlN plate. One composite sheet and one BN sheet were next cut with a rectangular hole in the center, leaving a smaller rectangle and frame for each sheet. The BN rectangle and the composite frame were fitted together, forming the green lead frame layer. Similarly, the BN frame and the composite rectangle were fitted together to form a replica layer to the green lead frame layer. Vias were punched in the green lead frame layer to register with contact points in the AlN layer, using a punching and metal filling process described in USSN 148,829. This involves punching out the via holes, then filling the holes by punching into them a copper (Cu) green tape formulation comprised of a homogeneous mixture of Cu powder and polyethylene binder. This formulation was produced in much the same was as the AlN, BN, and AlN-borosilicate green sheets described previously. In this case, a formulation consisting of 90.5 percent copper powder, 1.7 percent polyethylene and 7.8 percent mineral oil was compounded at approximately 160° C., molded into a sheet and placed into trichloroethane to remove the oil. The leads were screen printed onto the green sheet using a Cu powder-containing ink. FIGS. 4–7 illustrate the green lead frame layer and its corresponding replicate.

The seal ring layer was produced in a similar fashion to that of the lead frame layer. In this case, two rectangular cuts were made in the rectangular green sheets, resulting in two rectangular frames and a smaller rectangle. The green seal ring layer is put together with a BN frame and rectangle encompassing a composite frame. Copper vias were also placed in the seal ring layer using the same technique as that used for the lead frame layer. Copper metallization was subsequently screen printed onto one side of the composite frame. FIGS. 8–11 show the metallized green seal ring layer and its corresponding replica layer, respectively.

A green laminate was constructed with the following sequence of layers: (1) the AlN base, (2) the lead frame layer, (3) the seal ring layer, (4) the lead frame replicate, (5) the seal ring replicate, and (5) a BN sheet (see FIG. 12). This laminate was warm pressed at approximately 110° C and approximately 200 psi pressure for a few minutes, sufficient to bond the layers together. The monolithic green laminate was then placed in a graphite die having internal cavity dimensions matching those of the package and hot pressed to approximately 950° C. and 700 psi uniaxial pressure under nitrogen atmosphere for 1 hour. After hot pressing, the excess BN was removed from the package by a combination of grit blasting and washing in water.

The result of the foregoing operations was a multi-layer electronic package consisting of an AlN-borosilicate glass composite seal ring and lead frame on a dense AlN base. The copper metallization on each layer was adherent and electrically conductive.

A RECAPITULATION

Greenware

We make a greenware laminate comprising densified AlN base, one or more green sheets of AlN-borosilicate glass; and a green sheet of BN. The AlN optionally lies sandwiched between a BN green sheet and an AlN-borosilicate green sheet. The green sheet of AlN-borosilicate preferably outlines (frames) an exposed surface cavity, and preferably that cavity encloses (is filled with) a plug of BN; the whole being topped with a BN green sheet. The densified AlN base may be metallized internally and/or externally. (By "internally" we mean metallization is between layers of AlN and AlN-borosilicate glass. "Externally" simply means exposed.) Layers of both AlN and AlN-borosilicate may be metalized. The layers may contain vias, which may be filled with a homogeneous mixture of a binder (as above defined) and a compatible metal (as above defined), suitably Cu.

In one embodiment (see FIG. 13), a greenware laminate comprises in layered succession:

(1) as bottom layer, a densified AlN base;
(2) green sheet of AlN-borosilicate glass lead frame, said lead frame enclosing a green sheet plug of BN;
(3) A second frame of BN green sheet, said second frame enclosing a third frame of AlN-borosilicate glass green sheet as a seal ring, said third frame enclosing a green sheet plug of BN; and
(4) as top layer, a green sheet of BN.

In another embodiment (see FIG. 12), using our replication technique, the first three layers are assembled as aforesaid. On these are placed in sequence:

(5) a green sheet frame of BN enclosing a plug of AlN-borosilicate glass composite green sheet;
(6) A green sheet ring of AlN-borosilicate composite, enclosing a BN green sheet ring, which encloses a plug of AlN-borosilicate composite green sheet; and
(7) as top layer, a green sheet of BN.

The above assemblies are given bottom to top, but of course they can be inverted for placement within the hot press. (The apparatus makes no distinction.)

The AlN base and seal ring are preferably metallized (e.g., by screen printing) and the laminate can be provided with vias, suitably filled with Cu-polyethylene.

Hot Pressing

Hot pressing the above greenware laminates alters the laminates in important respects: the binder is burnt off; the AlN-borosilicate layers are densified, and (when using the preferred replication technique) uniform densification of the bonding layers is achieved. Aside from these changes, the hot pressed products are substantially identical to the respective starting greenware laminates. Removal of BN powder gives the final invention products. For example, in its broad aspect hot pressing gives an electronic package comprising densified AlN base, with one or more densified layers bonded thereto. Preferably the greenware laminate is chosen so that the AlN-borosilicate layer sits on the AlN base (preferably metallized), as a frame defining a cavity. Final articles can be similarly made from each of the greenware laminates herein described.

Our replication technique can be used with all our greenware laminates in our hot pressing process to make all our final electronic packages as herein described.

The AlN-borosilicate Composite

Our novel AlN-borosilicate glass composite and compositions made therefrom represent important aspects of our invention. These materials include (a) the homogeneous blend of AlN powder and borosilicate powder with binder and plasticizer; (b) sheets made from said blend; (c) said sheets from which plasticizer has been extracted; (d) plasticizer-extracted sheets as greenware; and (e) hot-pressed (sintered) densified AlN-borosilicate glass composite, per se. (In the general case the composite in (e) is a shape bonded to a foundation layer, e.g., to densified AlN or to another layer or shape of composite.)

The AlN:borosilicate ratio in the aforesaid composite suitably lies within the weight range of about 1:0.45–0.70. The $B_2O_3$:$SiO_2$ weight range suitably lies within the range of about 1:2.46–6.23. The borosilicate suitably contains minor amounts of oxides of light metals, e.g., $Li_2O$, etc.

It is understood that the foregoing detailed description is given merely by way of illustration and that many variations may be made therein without departing from the spirit of this invention.

What is claimed is:

1. An electronic package having a ceramic support structure comprising a densified AlN base layer and at least one densified AlN-borosilicate glass composite layer bonded thereto, said borosilicate glass comprising about 10 to 28 wt % $B_2O_3$, 60 81 wt % $SiO_2$, 1 to 4 wt % $Al_2O_3$ and 2 to 10 wt % of one or more members of the group $Li_2O$, $Na_2O$, $K_2O$ or CaO; and wherein the weight ratio of AlN to borosilicate glass is 1:0.45–0.70.

2. A package according to claim 1, wherein at least one of the layers if metallized.

3. Package according to claim 2, wherein the AlN base is metallized.

4. A package according to claim 1, further containing conductive vias through the layers.

5. A package according to claim 2, further containing conductive vias through the layers.

6. A package according to claim 1, wherein the AlN-borosilicate lgass layer bonded to the AlN base contains a cavity.

* * * * *

UNITED STATES PATENT AND TRADEMARK OFFICE
CERTIFICATE OF CORRECTION

PATENT NO. : 5,017,434

DATED : May 21, 1991

INVENTOR(S) : Jack Harrison Enloe, John Wing-Keung Lau and Roy Warren Rice

It is certified that error appears in the above-identified patent and that said Letters Patent is hereby corrected as shown below:

Col. 14, line 42, delete "60 81" and insert -- 60 to 81--

Col. 14, line 55, delete "lgass" and insert --glass--.

Signed and Sealed this

Twentieth Day of April, 1993

Attest:

MICHAEL K. KIRK

*Attesting Officer*  Acting Commissioner of Patents and Trademarks